United States Patent
Kondo et al.

(10) Patent No.: US 8,824,520 B2
(45) Date of Patent: Sep. 2, 2014

(54) SURFACE EMITTING SEMICONDUCTOR LASER, SURFACE EMITTING SEMICONDUCTOR LASER DEVICE, OPTICAL TRANSMISSION DEVICE, AND INFORMATION PROCESSING APPARATUS

(71) Applicant: Fuji Xerox Co., Ltd., Tokyo (JP)

(72) Inventors: Takashi Kondo, Kanagawa (JP); Kazutaka Takeda, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/899,086

(22) Filed: May 21, 2013

(65) Prior Publication Data

US 2014/0112364 A1   Apr. 24, 2014

(30) Foreign Application Priority Data

Oct. 24, 2012   (JP) .................. 2012-234340

(51) Int. Cl.
*H01S 5/00* (2006.01)
*H01S 5/18* (2006.01)

(52) U.S. Cl.
CPC ...................... *H01S 5/18* (2013.01)
USPC .............. 372/50.124; 372/45.01; 372/49.01

(58) Field of Classification Search
USPC ................ 372/45.01, 49.01, 50.124
See application file for complete search history.

(56) References Cited

FOREIGN PATENT DOCUMENTS

| JP | 2005-108983 A | 4/2005 |
|---|---|---|
| JP | 2005-129960 A | 5/2005 |
| JP | 2009-152553 A | 7/2009 |

OTHER PUBLICATIONS

H.J. Unold, et al., "Improving Single-Mode VCSEL Performance by Introducing a Long Monolithic Cavity", IEEE Photonics Technology Letters, Aug. 2000, pp. 939-941, vol. 12, No. 8.

S.W.Z. Mahmoud, et al., "Analysis of longitudinal mode wave guiding in vertical-cavity surface-emitting lasers with long monolithic cavity", Applied Physics Letters, Jan. 29, 2001, pp. 586-588, vol. 78, No. 5.

*Primary Examiner* — Armando Rodriguez (74) *Attorney, Agent, or Firm* — Sughrue Mion, PLLC (57) ABSTRACT

A laser includes: a substrate; a first reflector including pairs of high and low refractive index layers; an active region forming a resonator; a second reflector including an emission surface and pairs of high and low refractive index layers; an extending region thicker than oscillation wavelength, extending the length of the resonator, and including a conductive semiconductor material; a confining layer including a high refractive index region and a surrounding low refractive index region; and an additional film allowing the oscillation wavelength to transmit therethrough. The first and second reflectors, the extending region, and the active region determine a reflection band including resonance wavelengths, in one of which oscillation occurs. The additional film includes central and outer circumferential portions having different thicknesses to suppress resonance in the high refractive index region and the extending region. The central and outer circumferential portions overlap the high and low refractive index regions, respectively.

10 Claims, 7 Drawing Sheets

SURFACE EMITTING SEMICONDUCTOR LASER, SURFACE EMITTING SEMICONDUCTOR LASER DEVICE, OPTICAL TRANSMISSION DEVICE, AND INFORMATION PROCESSING APPARATUS

CROSS-REFERENCE TO RELATED APPLICATIONS

This application is based on and claims priority under 35 USC 119 from Japanese Patent Application No. 2012-234340 filed Oct. 24, 2012.

BACKGROUND

Technical Field

The present invention relates to a surface emitting semiconductor laser, a surface emitting semiconductor laser device, an optical transmission device, and an information processing apparatus.

A surface emitting semiconductor laser is a light emitting element that emits laser light in a direction perpendicular to a substrate. Therefore, the surface emitting semiconductor laser is easily configured as a two-dimensional array, and has been put to practical use in light sources for printers, image forming apparatuses, optical communication, and so forth. Further, to stably operate the surface emitting semiconductor laser in a single transverse mode, studies have been made to cause a difference in loss between a fundamental transverse mode and a high-order transverse mode.

SUMMARY

According to an aspect of the invention, there is provided a surface emitting semiconductor laser including a substrate, a first semiconductor multilayer reflector, an active region, a second semiconductor multilayer reflector, a cavity extending region, a light confining layer, and an emission surface additional film. The first semiconductor multilayer reflector is formed on the substrate, and includes laminated pairs of a high refractive index layer having a relatively high refractive index and a low refractive index layer having a relatively low refractive index. The active region is formed on or above the first semiconductor multilayer reflector, and forms a resonator. The second semiconductor multilayer reflector is formed on or above the active region, and includes an emission surface and laminated pairs of a high refractive index layer having a relatively high refractive index and a low refractive index layer having a relatively low refractive index. The cavity extending region is formed between the first semiconductor multilayer reflector and the active region or between the second semiconductor multilayer reflector and the active region, has an optical film thickness greater than an oscillation wavelength, extends the length of the resonator of the active region, and includes a conductive semiconductor material. The light confining layer is formed above the substrate, and includes a low refractive index region having a relatively low refractive index and a high refractive index region having a relatively high refractive index and surrounded by the low refractive index region. The emission surface additional film is formed on the emission surface of the second semiconductor multilayer reflector, and is made of a material allowing the oscillation wavelength to transmit therethrough. The first semiconductor multilayer reflector, the cavity extending region, the active region, and the second semiconductor multilayer reflector determine a reflection band that includes at least two resonance wavelengths, and oscillation occurs in a selected one of the resonance wavelengths. The emission surface additional film includes a central portion and an outer circumferential portion having different film thicknesses to suppress possible resonance in the high refractive index region of the light confining layer and the cavity extending region. The central portion is positioned to overlap the high refractive index region of the light confining layer, and the outer circumferential portion is positioned to overlap the low refractive index region of the light confining layer.

BRIEF DESCRIPTION OF THE DRAWINGS

Exemplary embodiments of the present invention will be described in detail based on the following figures, wherein.

DETAILED DESCRIPTION

Exemplary embodiments of the present invention will now be described with reference to the drawings. A surface emitting semiconductor laser (vertical cavity surface emitting laser, which will hereinafter be referred to as the VCSEL) is used in light sources of communication devices and image forming apparatuses. For an increase in processing speed of printers and so forth, there is and will be a demand for a single-mode, high-power VCSEL. To obtain a single mode (fundamental transverse mode) with a VCSEL having a related-art oxide confinement structure, it is necessary to set the diameter of an oxide aperture to 2 to 3 μm. With this oxide aperture diameter, however, it is difficult to stably obtain a single-mode output of 3 mW or more. An increase in oxide aperture diameter may realize higher power, but causes multi-mode (high-order transverse mode) oscillation. Therefore, a VCSEL having an extended cavity structure is expected to serve as a technique of realizing higher optical power while maintaining the single mode irrespective of the increase in oxide aperture diameter.

According to a VCSEL having an extended cavity structure, a spacer layer corresponding to a few times to dozen times the oscillation wavelength $\lambda$ is inserted between a light emitting region and a semiconductor multilayer reflector (distributed Bragg reflector, which will hereinafter be referred to as the DBR) in a VCSEL having a common $\lambda$ cavity structure to increase the cavity length and thereby increase the loss in the high-order transverse mode. Accordingly, single-mode oscillation is possible with an oxide aperture diameter greater than the oxide aperture diameter of the VCSEL having a $\lambda$ cavity structure.

In the following description, a selective oxidation-type VCSEL having an extended cavity structure will be described as an example. It should be noted that the scale of the drawings is emphasized for the purpose of clarifying features of exemplary embodiments of the invention, and is not necessarily the same as the scale of actual devices.

Exemplary Embodiments

Figure 1:
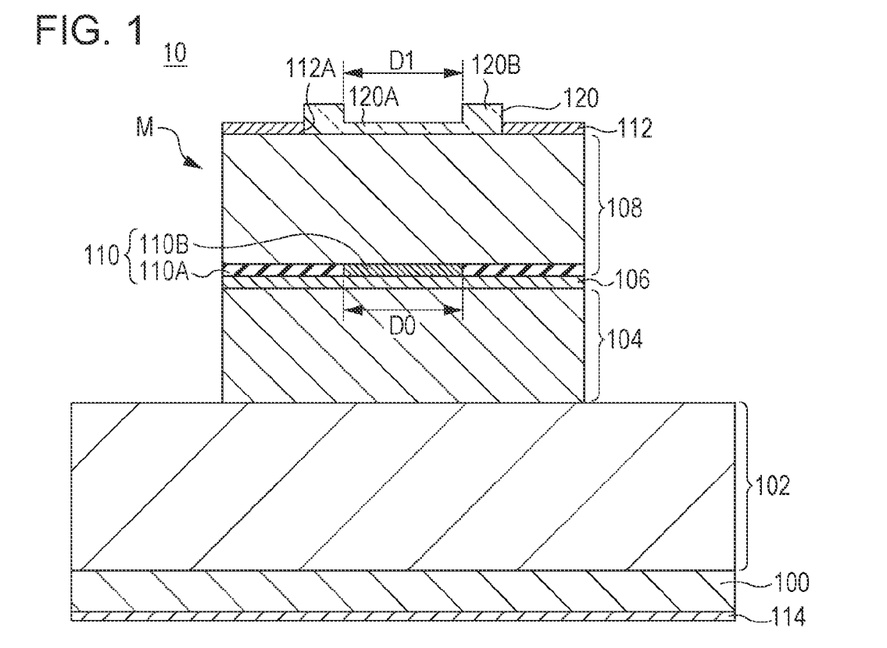
FIG. 1 is a schematic cross-sectional view of a surface emitting semiconductor laser having an extended cavity structure according to a first exemplary embodiment of the invention.

FIG. 1 is a schematic cross-sectional view of a VCSEL having an extended cavity structure according to an exemplary embodiment of the invention. As illustrated in FIG. 1, a VCSEL 10 of the present exemplary embodiment is configured to include an n-type lower DBR 102, a cavity extending region 104, an active region 106, and a p-type upper DBR 108 laminated on an n-type GaAs substrate 100. The n-type lower DBR 102 includes alternately laminated AlGaAs layers of different Al compositions. The cavity extending region 104 is formed on the lower DBR 102, and extends the cavity length. The active region 106 is formed on the cavity extending region 104, and includes a multiple quantum well layer sandwiched by upper and lower spacer layers. The p-type upper DBR 108 is formed on the active region 106, and includes alternately laminated AlGaAs layers of different Al compositions.

The n-type lower DBR 102 is a multilayer laminate of pairs of, for example, an $Al_{0.9}Ga_{0.1}As$ layer and an $Al_{0.3}Ga_{0.7}As$ layer. The layers each have a thickness of $\lambda/4n_r$ (wherein $\lambda$ represents the oscillation wavelength, and $n_r$ represents the refractive index of a medium), and are alternately laminated by 40 periods. The carrier concentration of the n-type lower DBR 102 after doping with silicon as an n-type impurity is $3\times10^{18}$ cm$^{-3}$, for example.

The cavity extending region 104 is a monolithic layer formed by repeating epitaxial growth. Therefore, the cavity extending region 104 is made of a material that matches or is consistent with the GaAs substrate 100 in lattice constant, such as AlGaAs, GaAs, or AlAs. Herein, the cavity extending region 104 is made of AlGaAs not causing light absorption to emit laser light in a band of 780 nm to 850 nm. The cavity extending region 104 has a film thickness corresponding to a few times to dozen times the oscillation wavelength $\lambda$, and increases the moving distance of carrier. It is therefore desirable that the cavity extending region 104 is of the n-type having high carrier mobility. For this reason, the cavity extending region 104 is inserted between the n-type lower DBR 102 and the active region 106. For example, the film thickness of the cavity extending region 104 is desirably at least one of a thickness corresponding to a range of $5\lambda$ to $20\lambda$ ($\lambda$ represents a desired oscillation wavelength) and a thickness allowing multiple resonance wavelengths to be included in a reflection band (a band having a reflectance of 97% or higher in the present exemplary embodiment). Such a cavity extending region 104 may also be referred to as a cavity extending region or a cavity space. Further, at least two resonant modes are present in the reflection band of the surface emitting laser configured to include the cavity extending region 104 formed on the lower DBR 102 and extending the cavity length, the active region 106 formed on the cavity extending region 104 and including the multiple quantum well layer sandwiched by the upper and lower spacer layers, and the p-type upper DBR 108 formed on the active region 106 and including the alternately laminated AlGaAs layers of different Al compositions. The oscillation selectively occurs in one of the resonant modes. In the range of the reflection band, the reflectance is 97% or higher. Even if a resonant mode is present in a region having a reflectance lower than 97%, adverse effects, such as optical noise, optical kink, and oscillation wavelength switching, are not caused.

In the active region 106, the lower spacer layer is an undoped $Al_{0.6}Ga_{0.4}As$ layer, and the quantum well active layer is an undoped $Al_{0.11}Ga_{0.89}As$ quantum well layer and an undoped $Al_{0.3}Ga_{0.7}As$ barrier layer. Further, the upper spacer layer is an undoped $Al_{0.6}Ga_{0.4}As$ layer.

The p-type upper DBR 108 is a laminate of, for example, p-type $Al_{0.9}Ga_{0.1}As$ layers and p-type $Al_{0.4}Ga_{0.6}As$ layers. The layers each have a thickness of $\lambda/4n_r$, and are alternately laminated by 29 periods. The carrier concentration of the p-type upper DBR 108 after doping with carbon as a p-type impurity is $3\times10^{18}$ cm$^{-3}$, for example. Desirably, a contact layer made of p-type GaAs is formed on the uppermost layer of the upper DBR 108, and a current confining layer 110 made of p-type AlAs is formed on the lowermost layer of the upper DBR 108 or inside the upper DBR 108.

Semiconductor layers from the upper DBR 108 to the lower DBR 102 are etched to form a cylindrical mesa (substantially columnar structure) M on the substrate 100, and the current confining layer 110 is exposed by the mesa M. The current confining layer 110 is formed with an oxidized region 110A selectively oxidized from a side surface of the mesa M and a conductive region (oxide aperture) 110B surrounded by the oxidized region 110A. In an oxidation process, the oxidation rate is higher in an AlAs layer than in an AlGaAs layer, and the oxidized region 110A is oxidized inwardly from the side surface of the mesa M at a substantially constant speed. Therefore, a planar shape of the conductive region 110B parallel to the substrate 100 has a shape reflecting the outer shape of the mesa M, i.e., a circular shape, and the center thereof substantially matches the optical axis in the axial direction of the mesa M. In the VCSEL 10 having an extended cavity structure, it is possible to set the diameter of the conductive region 110B for obtaining the fundamental transverse mode to be greater than in a VCSEL having a common $\lambda$ cavity structure. For example, it is possible to increase the diameter of the conductive region 110B up to approximately 7 to 8 microns. Accordingly, it is possible to realize higher optical power.

The uppermost layer of the mesa M is formed with a ring-shaped p-side electrode 112 made of metal such as a laminate of Ti/Au. The p-side electrode 112 is ohmically connected to the contact layer of the upper DBR 108. The p-side electrode 112 is formed with a circular light emission window 112A with the center thereof matching the optical axis of the mesa M, and a region exposed by the light emission window 112A is covered by an emission surface additional film 120. A rear surface of the substrate 100 is formed with an n-side electrode 114.

The emission surface additional film 120 has a function of reducing the difference in equivalent refractive index between a portion near the optical axis and an outer circumferential portion thereof or reducing the reflectance of the outer circumferential portion, to thereby suppress slow-light resonance occurring in a light emitting region of the VCSEL having an extended cavity structure. As a result, high-power laser light in a single transverse mode and a single longitudinal mode is emitted with stable operation from the light emission window 112A of the p-side electrode 112.

The emission surface additional film 120 is made of a material allowing the oscillation wavelength to transmit therethrough. The emission surface additional film 120 is configured to include a circular central portion 120A near the optical axis and an outer circumferential portion 120B surrounding the central portion 120A and greater in film thickness than the central portion 120A. The film thickness of the outer circumferential portion 120B is adjusted such that the equivalent refractive index of the central portion 120A is lower than the equivalent refractive index of the outer circumferential portion 120B in the emission surface additional film 120. In a plan view, the central portion 120A is positioned to overlap the conductive region 110B of the current confining layer 110, and the center of the central portion 120A substantially matches the center of the conductive region 110B. In an exemplary embodiment, when D0 represents the diameter of the conductive region 110B and D1 represents the diameter of the central portion 120A, a relationship D1<D0 or D1≤D0 holds. In a plan view, the outer circumferential portion 120B is positioned to overlap the oxidized region 110A.

The emission surface additional film 120 is desirably made of a material lower in refractive index than the uppermost layer of the upper DBR 108 (a GaAs contact layer, for example), such as SiN, SiON, or $SiO_2$. For example, the film thickness of the central portion 120A corresponds to $\lambda \times (x/2n_1)$, and the film thickness of the outer circumferential portion 120B corresponds to $\lambda \times (y+1/2)/2n_1)$. Herein, $\lambda$ represents the oscillation wavelength, and x and y represent natural numbers (including zero). Further, $n_1$ represents the refractive index of the emission surface additional film 120.

Figure 2:
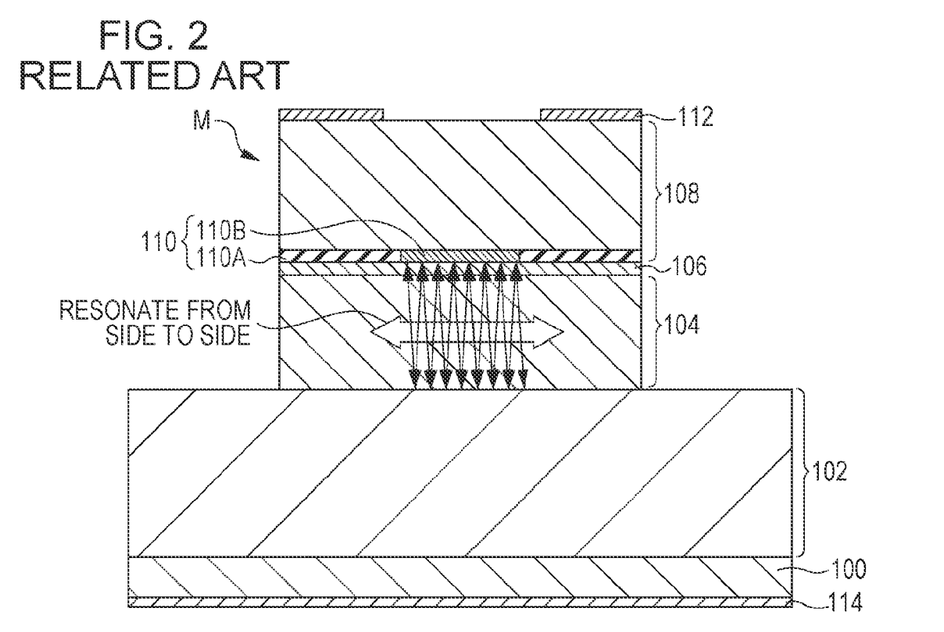
FIG. 2 is a diagram for describing the occurrence of slow-light resonance in a related-art surface emitting semiconductor laser having an extended cavity structure.

The slow-light resonance occurring in a VCSEL having an extended cavity structure will now be described. FIG. 2 illustrates a VCSEL corresponding to the VCSEL of FIG. 1 with the emission surface additional film 120 removed therefrom. The current confining layer 110 is typically made of AlAs or AlGaAs higher in Al composition than the lower DBR 102 and the upper DBR 108. The refractive index of AlAs is approximately 3.0, which is changed to approximately 1.7 by oxidation. The oxidation of AlAs also changes properties of AlAs to have a high electrical resistance. Thereby, light and carrier are confined in the conductive region 110B having a high refractive index.

It is revealed that, with the insertion of the cavity extending region 104 between the lower DBR 102 and the upper DBR 108, a new resonant mode (slow-light resonance) is generated in the light emitting region and adversely affects the reliability and the spectrum. The lower DBR 102 and the upper DBR 108 each have a substantially high reflectance of 99% or higher, and the light generated in the active region 106 travels in the lateral direction within the cavity extending region 104, while being reflected between the lower DBR 102 and the upper DBR 108 at a predetermined divergence angle. The light traveling in the lateral direction is confined in the conductive region 110B having a high refractive index. This indicates that the light is reflected by a reflecting end at the boundary between the conductive region 110B and the oxidized region 110A. In the region surrounded by the conductive region 110B and the cavity extending region 104, therefore, the light generated in the active region 106 may resonate in the horizontal direction (a direction parallel to a major surface of the substrate 100) as if in a Fabry-Perot et al on, i.e., so-called slow-light resonance may occur.

Figure 3:
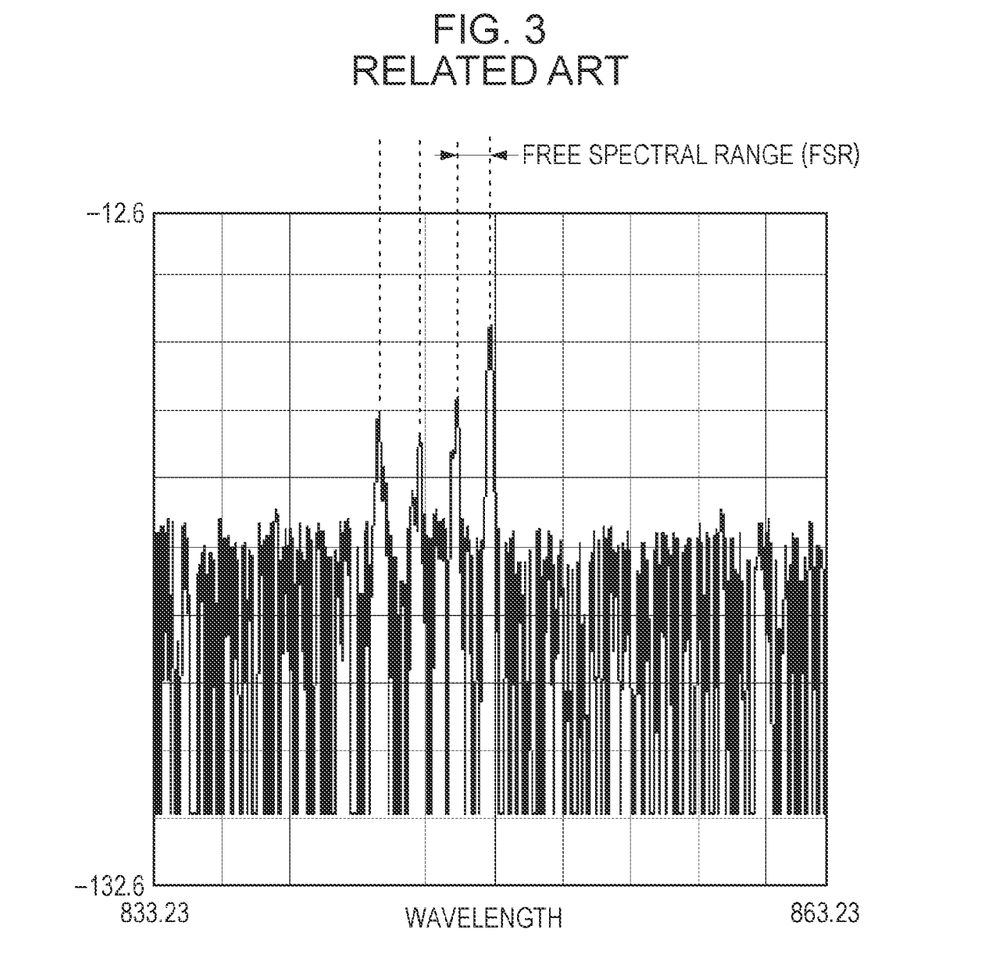
FIG. 3 is a graph illustrating a free spectral range of the slow-light resonance in the related-art surface emitting semiconductor laser having an extended cavity structure.

FIG. 3 is a graph illustrating the occurrence of such slow-light resonance, in which the horizontal axis represents the wavelength, and the vertical axis represents the level. When the oscillation wavelength $\lambda$ is set to 850 nm, a multitude of spectra are generated in a wavelength range of 833 nm to 863 nm, and slow-light resonance occurs in the range. A free spectral range (FSR) corresponding to the interval of the slow-light resonance is approximately 2 nm. In the slow-light resonance, spectra appear at substantially equal intervals. Such appearance of spectra is clearly different from the appearance of spectra in a usual transverse mode. Further, the value of the free spectral range depends on the diameter of the conductive region 110B (oxide aperture diameter) of the current confining layer 110. The smaller the diameter of the conductive region 110B is, the greater the value of the free spectral range is (the greater the interval is). The free spectral range (FSR) may be calculated from the following equation: $FSR=\lambda^2/2n_{eff}L$, wherein $\lambda$ represents the oscillation wavelength, $n_{eff}$ represents the equivalent refractive index, and L represents the length of resonance. For example, when the oscillation wavelength $\lambda$ is 850 nm, the equivalent refractive index $n_{eff}$ is 3.4, the length L of resonance is 60 μm, and the diameter of the conductive region 110B is 3 μm, the free spectral range FSR is 1.89 nm.

Figure 4:
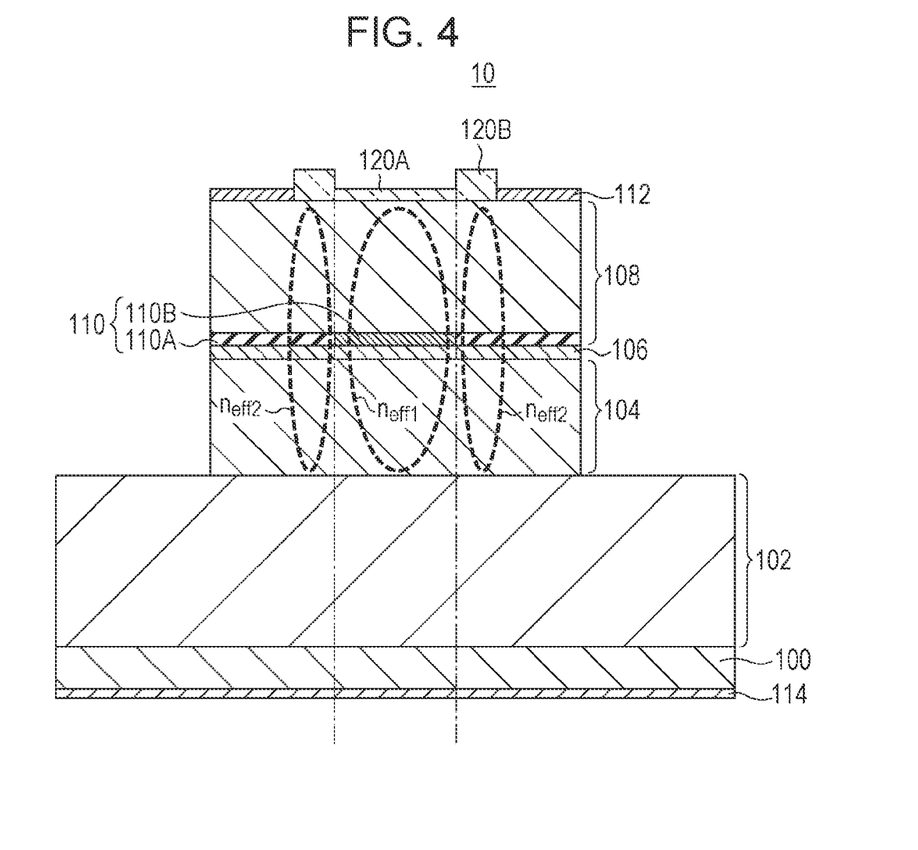
FIG. 4 is a diagram for describing the suppression of slow-light resonance in the surface emitting semiconductor laser having an extended cavity structure according to the first exemplary embodiment of the invention.

In the present exemplary embodiment, the emission surface additional film 120 has a function of suppressing the slow-light resonance. FIG. 4 is a diagram for describing the suppression of the slow-light resonance by the emission surface additional film 120. In a VCSEL having a common extended cavity structure, an equivalent refractive index $n_{eff2}$ of a resonator portion on the oxidized region 110A corresponding to the outer circumference of the conductive region 110B of the current confining layer 110 is lower than an equivalent refractive index $n_{eff1}$ of a resonator portion in the light emitting region on the conductive region 110B ($n_{eff2}<n_{eff1}$). Therefore, the light generated in the active region 106 is confined in the conductive region 110B, and is reflected by the reflecting end at the boundary between the conductive region 110B and the oxidized region 110A, as described above. As a result, the slow-light resonance occurs. The emission surface additional film 120 of the present exemplary embodiment includes the central portion 120A corresponding to the conductive region 110B and the outer circumferential portion 120B corresponding to the oxidized region 110A. Further, an air layer (with a refractive index of 1) is present above the central portion 120A, and an insulating layer (with a refractive index of 1.5 in the case of SiN, for example) is present at a position corresponding to an air layer above the outer circumferential portion 120B. Therefore, the equivalent refractive index $n_{eff2}$ of the resonator portion corresponding to the outer circumferential portion 120B increases, while the equivalent refractive index $n_{eff1}$ of the resonator portion corresponding to the central portion 120A remains the same. As a result, the different in equivalent refractive index between the central portion 120A and the outer circumferential portion 120B ($n_{eff1}-n_{eff2}$) is reduced, and the confinement of light is weakened. Thus, the amount of light reflected by the reflecting end in the slow-light resonance is reduced, and thereby the slow-light resonance is attenuated. With the attenuation of the slow-light resonance, laser light with a stable spectrum is emitted in a single transverse mode and a single longitudinal mode.

A second exemplary embodiment of the invention will now be described. In the second exemplary embodiment, the reflectance of the resonator portion corresponding to the outer circumferential portion 120B is adjusted by the emission surface additional film 120. Slow-light resonance requires a high reflectance above and below a waveguide, i.e., a resonator (spacer layer). To reduce the slow-light resonance, therefore, the reflectance is reduced in a resonator portion corresponding to the border between the oxidized region 110A and the conductive region 110B and a region near the border. In the second exemplary embodiment, therefore, the diameter D1 of the central portion 120A of the emission surface additional film 120 is desirably set to be smaller than the diameter D0 of the conductive region 110B (D1<D0). Further, it is desirable that the reflectance of the central portion 120A above the conductive region 110B remains high so as to maintain laser characteristics.

The emission surface additional film 120 is desirably made of a material lower in refractive index than the uppermost layer of the upper DBR 108 (a GaAs contact layer, for example), such as SiN, SiON, or $SiO_2$, for example. For example, the film thickness of the central portion 120A corresponds to $\lambda \times (x/2n_1)$, and the film thickness of the outer circumferential portion 120B corresponds to $\lambda \times (y+1/2)/2n_1$. Herein, $\lambda$ represents the oscillation wavelength, and x and y represent natural numbers (including zero). Further, $n_1$ represents the refractive index of the emission surface additional film 120.

In the second exemplary embodiment, the reflectance of the resonator portion corresponding to the outer circumferential portion 120B is reduced to increase the amount of light transmitted through (i.e., reduce the amount of light reflected by) the outer circumferential portion 120B and thereby attenuate the slow-light resonance. The second exemplary embodiment has been described as different from the first exemplary embodiment. With appropriate selection of the shape, material, and film thickness of the emission surface additional film 120, however, it is possible to realize, at the same time, both the reduction of the difference in equivalent refractive index according to the first exemplary embodiment and the reduction in reflectance of the resonator portion corresponding to the outer circumferential portion 120B according to the second exemplary embodiment.

Various examples of the emission surface additional film applicable to the first and second exemplary embodiments are illustrated in FIGS. 5A to 5D and FIGS. 6A to 6H. FIGS. 5A to 5D illustrate examples of an emission surface additional film 122 applicable to the first exemplary embodiment, in which the difference in equivalent refractive index between a central portion and an outer circumferential portion is reduced, as described above. FIGS. 6A to 6H illustrate examples of an emission surface additional film 124 applicable to the second exemplary embodiment, in which the reflectance of an outer circumferential portion is reduced, as described above. The emission surface additional films 122 and 124 respectively illustrated in FIGS. 5A to 5D and FIGS. 6A to 6H are each made of plural materials, while the emission surface additional film 120 illustrated in FIG. 1 is made of a single material.

Figure 5A:
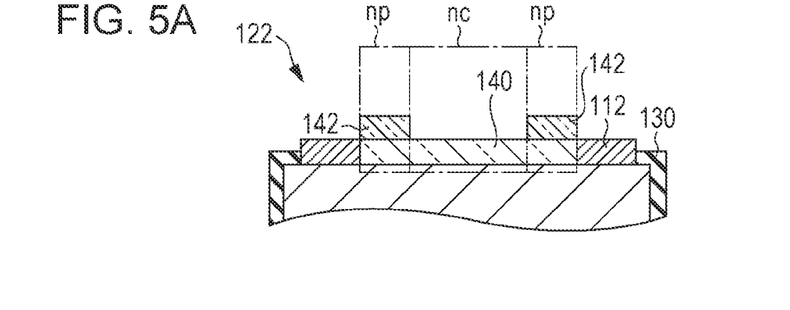
FIGS. 5A to 5D are diagrams each illustrating an example of an emission surface additional film applicable to the first exemplary embodiment of the invention.

In FIG. 5A, an interlayer insulating film 130 covers a side surface of a mesa and a peripheral edge of a top portion of the mesa, and the ring-shaped p-side electrode 112 is formed on a contact layer of the top portion of the mesa exposed by the interlayer insulating film 130. The emission surface additional film 122 is made of a first refractive index adjusting material 140 and a second refractive index adjusting material 142. The first refractive index adjusting material 140 is formed to cover the entire surface of the light emission window of the p-side electrode 112, and the ring-shaped second refractive index adjusting material 142 is laminated on the first refractive index adjusting material 140. A region exposed by the second refractive index adjusting material 142 defines the central portion. With appropriate selection of the material and the film thickness of each of the first refractive index adjusting material 140 and the second refractive index adjusting material 142, an equivalent refractive index nc of a single material of the first refractive index adjusting material 140 is made lower than an equivalent refractive index np of a laminate of the first refractive index adjusting material 140 and the second refractive index adjusting material 142. Thereby, the difference in equivalent refractive index $(n_{eff1} - n_{eff2})$ is reduced. For example, the first refractive index adjusting material 140 is made of SiON (with a refractive index of 1.57) lower in refractive index than the contact layer (GaAs) of the upper DBR 108, and the second refractive index adjusting material 142 is made of SiN (with a refractive index of 1.92) higher in refractive index than the first refractive index adjusting material 140.

Figure 5B:
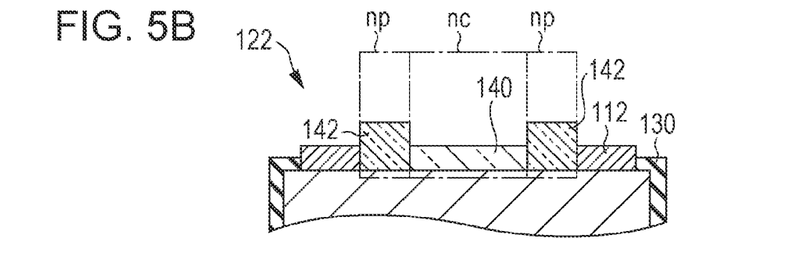

In the example illustrated in FIG. 5B, the first refractive index adjusting material 140 having an outer diameter smaller than the diameter of the light emission window is formed in the light emission window, and the ring-shaped second refractive index adjusting material 142 is formed around the first refractive index adjusting material 140. The second refractive index adjusting material 142 includes a material higher in refractive index than the first refractive index adjusting material 140, and the film thickness of the second refractive index adjusting material 142 is made greater that the film thickness than the first refractive index adjusting material 140. Thereby, it is possible to make the equivalent refractive index nc of the central portion lower than the equivalent refractive index np of the outer circumferential portion.

Figure 5C:
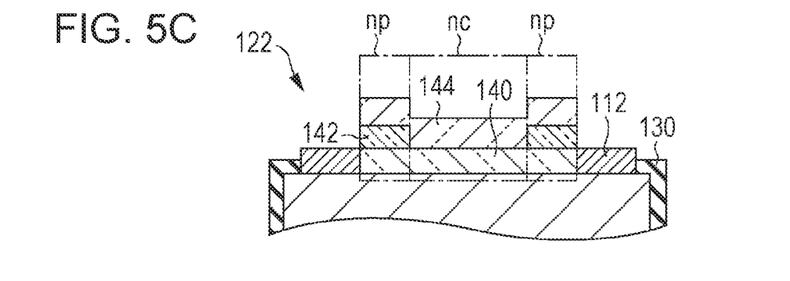
Figure 5D:
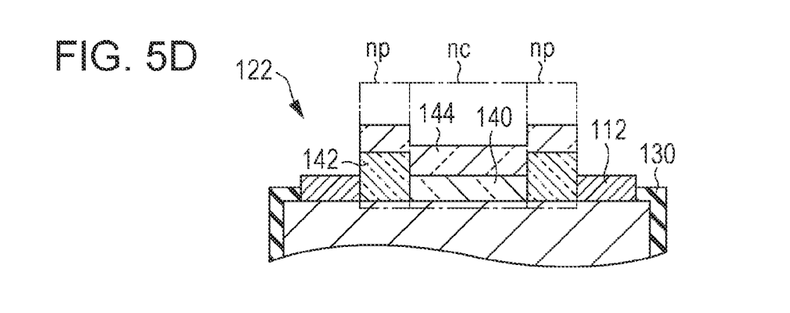

FIGS. 5C and 5D each illustrate an example in which the emission surface additional film 122 is configured to have a three-layer structure. FIG. 5C illustrates an example in which a third refractive index adjusting material 144 having a predetermined film thickness is laminated on the configuration of FIG. 5A. FIG. 5D illustrates an example in which the third refractive index adjusting material 144 is laminated on the configuration of FIG. 5B. The third refractive index adjusting material 144 includes a material allowing the oscillation wavelength to transmit therethrough, such as Sin, SiON, or $SiO_2$, for example. The material may be the same as or different from the first refractive index adjusting material 140 or the second refractive index adjusting material 142.

Figure 6A:
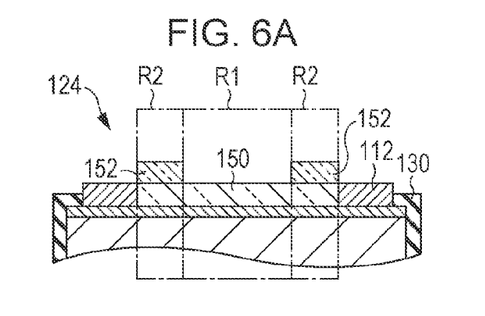
FIGS. 6A to 6H are diagrams each illustrating an example of an emission surface additional film applicable to a second exemplary embodiment of the invention.

The emission surface additional film 124 illustrated in FIG. 6A is made of a first reflectance adjusting material 150 and a second reflectance adjusting material 152. The first reflectance adjusting material 150 is formed to cover the entire surface of the light emission window of the p-side electrode 112, and the ring-shaped second reflectance adjusting material 152 is laminated on the first reflectance adjusting material 150. A region exposed by the second reflectance adjusting material 152 defines the central portion. With appropriate selection of the material and the film thickness of each of the first reflectance adjusting material 150 and the second reflectance adjusting material 152, a reflectance R2 of the resonator portion corresponding to the outer circumferential portion is reduced, while a reflectance R1 of the resonator portion corresponding to the central portion is maintained at a high value necessary for laser oscillation.

In an exemplary embodiment, the first reflectance adjusting material 150 is lower in refractive index than the contact layer of the upper DBR 108, has a film thickness corresponding to an odd multiple of half the oscillation wavelength, and includes a material such as SiON, $SiO_2$, SiN, or $TiO_2$, for example. The second reflectance adjusting material 152 is higher in refractive index than the first reflectance adjusting material 150, has a film thickness corresponding to an odd multiple of quarter the oscillation wavelength, and includes a material such as SiON, $SiO_2$, SiN, or $TiO_2$, for example.

Figure 6B:
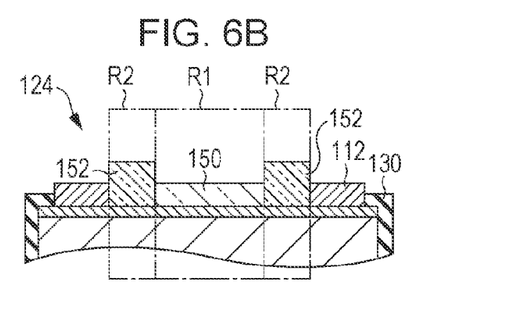

In the example illustrated in FIG. 6B, the first reflectance adjusting material 150 having an outer diameter smaller than the diameter of the light emission window is formed in the light emission window, and the ring-shaped second reflectance adjusting material 152 is formed around the first reflectance adjusting material 150. The second reflectance adjusting material 152 includes a material higher in refractive index than the first reflectance adjusting material 150. With appropriate selection of the film thickness of each of the first reflectance adjusting material 150 and the second reflectance adjusting material 152, it is possible to reduce the reflectance R2 of the resonator portion corresponding to the outer circumferential portion.

Figure 6C:
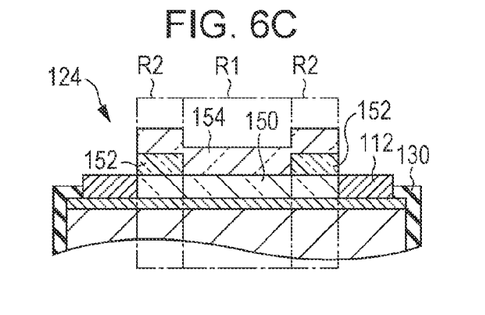
Figure 6D:
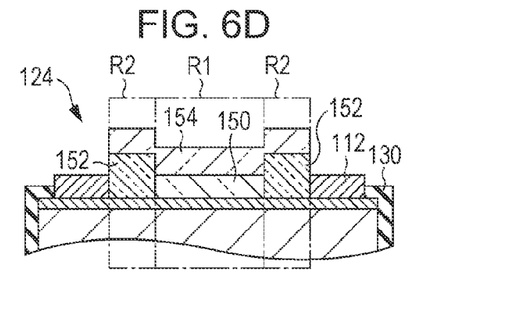

In the example of FIG. 6C, a third reflectance adjusting material 154 having a uniform film thickness is laminated on the configuration of FIG. 6A. In the example of FIG. 6D, the third reflectance adjusting material 154 is laminated on the configuration of FIG. 6B. The third reflectance adjusting material 154 includes a material allowing the oscillation wavelength to transmit therethrough, such as SiN, SiON, or $SiO_2$, for example. The material may be the same as or different from the first reflectance adjusting material 150 or the second reflectance adjusting material 152.

Figure 6E:
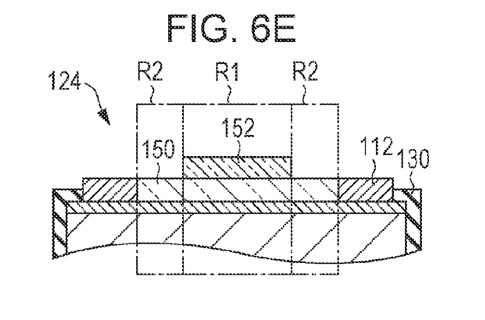

In FIG. 6E, the emission surface additional film 124 is made of the first reflectance adjusting material 150 covering the light emission window of the p-side electrode 112 and the circular second reflectance adjusting material 152 formed on the first reflectance adjusting material 150 to cover the central portion. In an exemplary embodiment, the film thickness of the first reflectance adjusting material 150 and the film thickness of the second reflectance adjusting material 152 corresponds to an odd multiple of quarter the oscillation wavelength $\lambda$. Further, the second reflectance adjusting material 152 is higher in refractive index than the first reflectance adjusting material 150, and the contact layer of the upper DBR 108 is higher in refractive index than the second reflectance adjusting material 152. For example, the first reflectance adjusting material 150 is SiON having a film thickness of $\lambda/4$, and the second reflectance adjusting material 152 is SiN having a film thickness of $\lambda/4$.

Figure 6F:
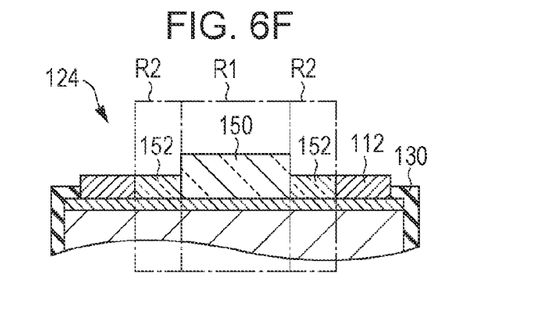

In the example of FIG. 6F, the first reflectance adjusting material 150 covering the central portion is formed in the light emission window, and the ring-shaped second reflectance adjusting material 152 is formed around the first reflectance adjusting material 150. Also in this case, with appropriate selection of the refractive index and the film thickness of each of the first reflectance adjusting material 150 and the second reflectance adjusting material 152, the reflectance R2 of the resonator portion corresponding to the outer circumferential portion is reduced.

Figure 6G:
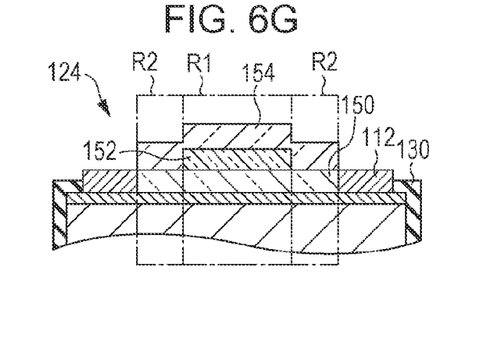
Figure 6H:
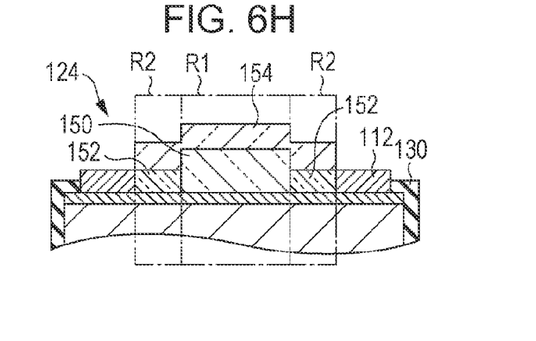

FIG. 6G illustrates an example in which the third reflectance adjusting material 154 having a uniform film thickness is laminated on the configuration of FIG. 6E. FIG. 6H illustrates an example in which the third reflectance adjusting material 154 having a uniform film thickness is laminated on the configuration of FIG. 6F. The third reflectance adjusting material 154 includes a material allowing the oscillation wavelength to transmit therethrough. The material may be the same as or different from the first reflectance adjusting material 150 or the second reflectance adjusting material 152.

Figure 7:
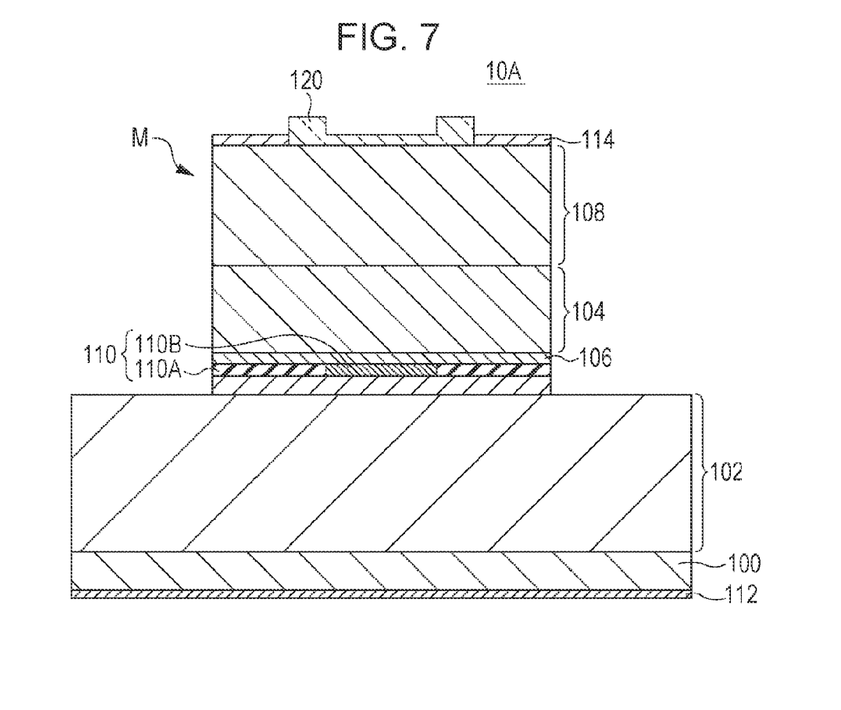
FIG. 7 is a schematic cross-sectional view of a surface emitting semiconductor laser having an extended cavity structure according to a third exemplary embodiment of the invention.

A third exemplary embodiment of the invention will now be described. FIG. 7 is a schematic cross-sectional view of a VCSEL 10A having an extended cavity structure according to the third exemplary embodiment. In the third exemplary embodiment, a p-type lower DBR 102 is formed on a p-type GaAs substrate 100. A low refractive index layer or a part thereof of the lower DBR 102 adjacent to the active region 106 is substituted by the current confining layer 110. The n-type cavity extending region 104 is formed on the active region 106. An n-type upper DBR 108 is formed on the cavity extending region 104. The p-side electrode 112 is formed on a bottom portion of the substrate 100. The n-side electrode 114 including a circular emission window is formed on a top portion of the upper DBR 108. The emission surface additional film 120 is formed in the emission window of the n-side electrode 114. To form the mesa M in the third exemplary embodiment, etching is performed to a depth reaching the lower DBR 102 to expose the current confining layer 110.

A fourth exemplary embodiment of the invention will now be described. As to the gain of a quantum well, on the basis of the difference in temperature dependence between the gain peak wavelength and the resonance wavelength, the composition of the semiconductor material forming the VCSEL having an extended cavity structure is usually adjusted such that the gain peak wavelength of the quantum well is shorter than a desired resonance wavelength at room temperature. Alternatively, the configuration of the VCSEL is adjusted to set the gain peak wavelength to be shorter than the desired resonance wavelength at the lowest temperature in a usable temperature range, and set the gain peak wavelength to be longer than the desired resonance wavelength at the highest temperature in the usable temperature range.

According to the fourth exemplary embodiment, when the VCSEL having an extended cavity structure is driven by a constant drive current, the gain peak wavelength of the active layer is set to be shorter than the resonance wavelength of the resonator. Thereby, the two wavelengths match each other with an increase in temperature, and the temperature dependence of a threshold current in a desired operating temperature range is reduced. Accordingly, it is possible to suppress a reduction in optical power at a high temperature.

Exemplary embodiments of the present invention have been described in detail above. The invention, however, is not limited to specific exemplary embodiments, and may be altered or modified in various ways within the scope of the gist of the invention described in the claims.

In the above-described exemplary embodiments, the lower DBR 102 and the upper DBR 108 are made of AlGaAs. The pair of the high refractive index layer and the low refractive index layer, however, may be made of a semiconductor material other than AlGaAs. For example, the pair may be the combination of GaAs as the high refractive index layer and AlGaAs as the low refractive index layer. Further, in the case of a long oscillation wavelength, the DBRs may be made of GaAs.

In the above-described exemplary embodiments, the single current confining layer 110 has been described as an example. The current confining layer 110, however, may be provided in plurality. Further, in the above-described exemplary embodiments, the description has been given of an example in which the light and the carrier are confined by the current confining layer 110. The present invention, however, may also be applied to a VCSEL using, in place of the current confining layer 110, a light confining layer that confines the light. Furthermore, in the above-described exemplary embodiments, the description has been given of an example in which the n-side electrode 114 or the p-side electrode 112 is formed on the rear surface of the substrate 100. The n-side electrode 114 or the p-side electrode 112, however, may be directly connected to the lower DBR 102. In this case, the substrate 100 may be semi-insulating.

Further, a buffer layer may be formed, as necessary, between the GaAs substrate 100 and the lower DBR 102. Further, although a GaAs-based VCSEL has been described as an example in the above-described exemplary embodiments, the invention may also be applied to a VCSEL having an extended cavity structure using another III-V group compound semiconductor. Further, although a single-spot VCSEL has been described as an example in the above-described exemplary embodiments, the VCSEL may be a multi-spot VCSEL including a multitude of mesas (light emitting portions) formed on a substrate, or may be a VCSEL array.

Figure 8A:
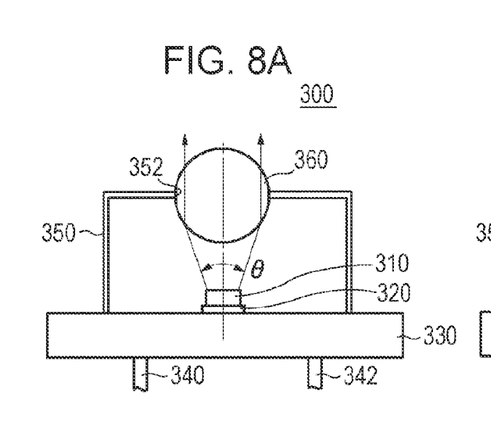
FIGS. 8A and 8B are schematic cross-sectional views each illustrating the configuration of a surface emitting semiconductor laser device mounted with the surface emitting semiconductor laser according to one of the exemplary embodiments and an optical member.

With reference to the drawings, description will now be given of a surface emitting semiconductor laser device, an optical information processing apparatus, and an optical transmission device using the VCSEL having an extended cavity structure according to one of the exemplary embodiments. FIG. 8A is a cross-sectional view illustrating the configuration of a surface emitting semiconductor laser device mounted (packaged) with the VCSEL and an optical member. In a surface emitting semiconductor laser device 300, a chip 310 formed with the VCSEL having an extended cavity structure is fixed on a disc-shaped metal stem 330 via a conductive adhesive 320. Conductive leads 340 and 342 are inserted in through-holes (illustration thereof is omitted) formed in the stem 330, with the lead 340 electrically connected to the n-side electrode of the VCSEL and the other lead 342 electrically connected to the p-side electrode of the VCSEL.

A rectangular hollow cap 350 is fixed on the stem 330 including the chip 310, and a ball lens 360 serving as an optical member is fixed in an opening 352 at the center of the cap 350. The optical axis of the ball lens 360 is positioned to substantially match the center of the chip 310. When a voltage in a forward direction is applied between the leads 340 and 342, laser light is emitted in the vertical direction from the chip 310. The distance between the chip 310 and the ball lens 360 is adjusted such that the ball lens 360 is situated within a divergence angle θ of the laser light from the chip 310. Further, a light receiving element or a temperature sensor for monitoring the light emission state of the VCSEL may be included in the cap 350.

Figure 8B:
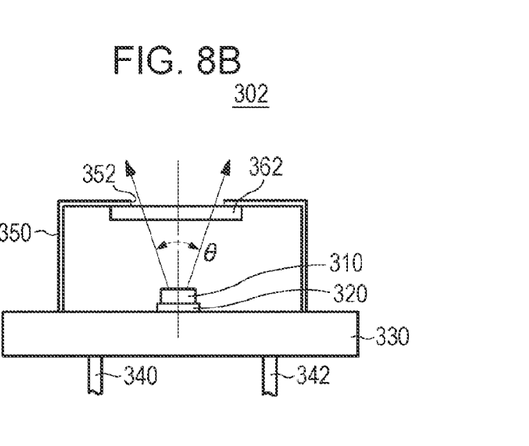

FIG. 8B is a diagram illustrating the configuration of another surface emitting semiconductor laser device. In a surface emitting semiconductor laser device 302 illustrated in FIG. 8B, the ball lens 360 is replaced by a flat glass 362 fixed in the opening 352 at the center of the cap 350. The center of the flat glass 362 is positioned to substantially match the center of the chip 310. The distance between the chip 310 and the flat glass 362 is adjusted such that the aperture diameter of the flat glass 362 is equal to or greater than the divergence angle θ of the laser light from the chip 310.

Figure 9:
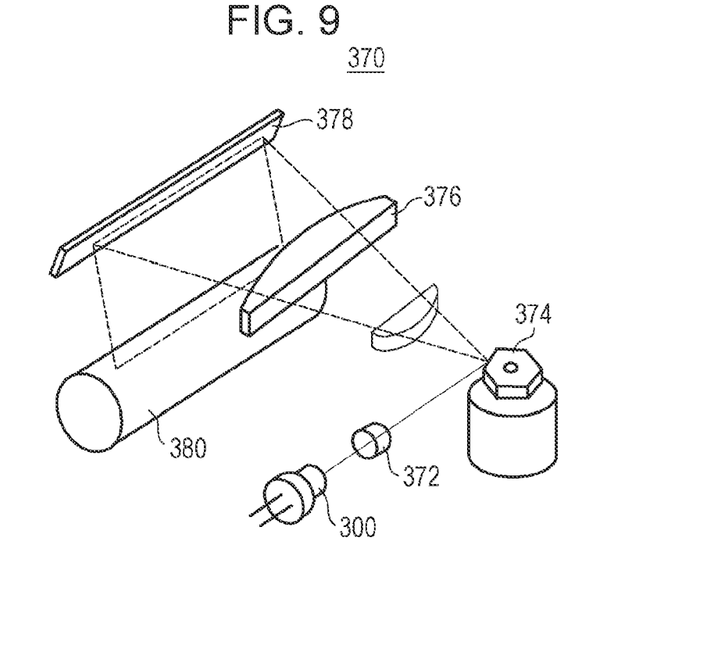
FIG. 9 is a diagram illustrating the configuration example of a light source device using the surface emitting semiconductor laser according to one of the exemplary embodiments.

FIG. 9 is a diagram illustrating an example in which the VCSEL is applied to a light source of an optical information processing apparatus. An optical information processing apparatus 370 includes a collimator lens 372, a polygon mirror 374, an fθ lens 376, a linear reflecting mirror 378, and a photoconductor drum (recording medium) 380. The collimator lens 372 receives the laser light incident thereon from the surface emitting semiconductor laser device 300 or 302 mounted with the VCSEL having an extended cavity structure as in FIG. 8A or 8B. The polygon mirror 374 rotates at a constant speed, and reflects a beam of light from the collimator lens 372 at a predetermined divergence angle. The fθ lens 376 receives the laser light incident thereon from the polygon mirror 374, and radiates the laser light onto the reflecting mirror 378. On the photoconductor drum 380, a latent image is formed on the basis of the light reflected by the reflecting mirror 378. The VCSEL may thus be used as a light source of an optical information processing apparatus, such as a copier or a printer, including an optical system that condenses the laser light from the VCSEL onto a photoconductor drum and a mechanism that scans the condensed laser light on the photoconductor drum.

Figure 10:
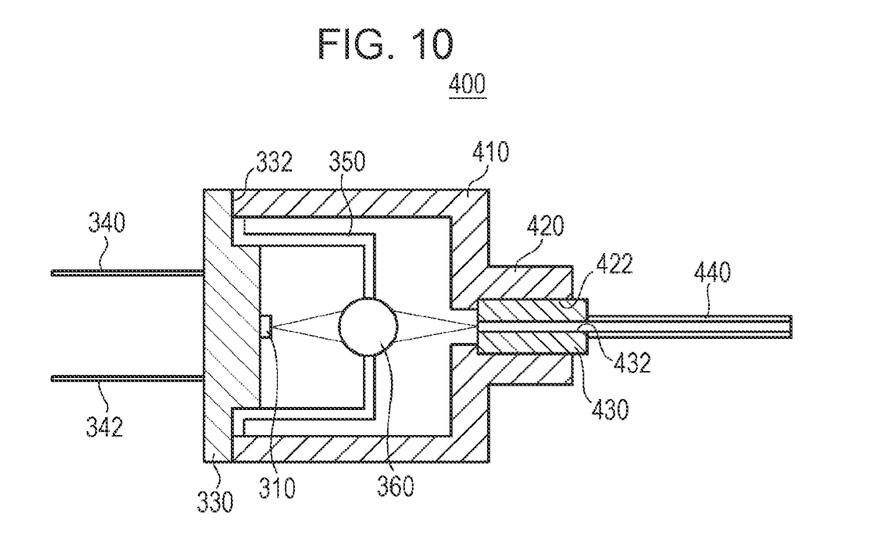
FIG. 10 is a schematic cross-sectional view illustrating the configuration of an optical transmission device using the surface emitting semiconductor laser device illustrated in FIG. 8A.

FIG. 10 is a cross-sectional view illustrating the configuration of an optical transmission device applied with the surface emitting semiconductor laser device illustrated in FIG. 8A. An optical transmission device 400 is configured to include a cylindrical housing 410 fixed to the stem 330, a sleeve 420 formed integrally with an end surface of the housing 410, a ferrule 430 held in an opening 422 of the sleeve 420, and an optical fiber 440 held by the ferrule 430. An end portion of the housing 410 is fixed to a flange 332 formed in the circumferential direction of the stem 330. The ferrule 430 is accurately positioned in the opening 422 of the sleeve 420 to match the optical axis of the optical fiber 440 with the optical axis of the ball lens 360. A core of the optical fiber 440 is held in a through-hole 432 of the ferrule 430.

The laser light emitted from a surface of the chip 310 is condensed by the ball lens 360. The condensed light is incident on the core of the optical fiber 440, and is transmitted. Although the above-described example uses the ball lens 360, a lens other than the ball lens 360, such as a biconvex lens or a plano-convex lens, may be used. Further, the optical transmission device 400 may include a drive circuit for applying electrical signals to the leads 340 and 342. Further, the optical transmission device 400 may have a reception function for receiving optical signals via the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface emitting semiconductor laser comprising:
   a substrate;
   a first semiconductor multilayer reflector formed on the substrate, and including laminated pairs of a high refractive index layer having a relatively high refractive index and a low refractive index layer having a relatively low refractive index;
   an active region formed on or above the first semiconductor multilayer reflector, and forming a resonator;
   a second semiconductor multilayer reflector formed on or above the active region, and including an emission surface and laminated pairs of a high refractive index layer having a relatively high refractive index and a low refractive index layer having a relatively low refractive index;
   a cavity extending region formed between the first semiconductor multilayer reflector and the active region or between the second semiconductor multilayer reflector and the active region, having an optical film thickness greater than an oscillation wavelength, extending the length of the resonator of the active region, and including a conductive semiconductor material;

a light confining layer formed above the substrate, and including a low refractive index region having a relatively low refractive index and a high refractive index region having a relatively high refractive index and surrounded by the low refractive index region; and an emission surface additional film formed on the emission surface of the second semiconductor multilayer reflector, and made of a material allowing the oscillation wavelength to transmit therethrough, wherein the first semiconductor multilayer reflector, the cavity extending region, the active region, and the second semiconductor multilayer reflector determine a reflection band that includes at least two resonance wavelengths, and oscillation occurs in a selected one of the resonance wavelengths, wherein the emission surface additional film includes a central portion and an outer circumferential portion having different film thicknesses to suppress possible resonance in the high refractive index region of the light confining layer and the cavity extending region, and wherein the central portion is positioned to overlap the high refractive index region of the light confining layer, and the outer circumferential portion is positioned to overlap the low refractive index region of the light confining layer.

2. The surface emitting semiconductor laser according to claim 1, wherein the emission surface additional film reduces a difference in equivalent refractive index between a resonator portion corresponding to the central portion and a resonator portion corresponding to the outer circumferential portion.

3. The surface emitting semiconductor laser according to claim 1, wherein the central portion has a diameter equal to or smaller than a diameter of the high refractive index region.

4. The surface emitting semiconductor laser according to claim 1, wherein the emission surface additional film reduces a reflectance of a resonator portion corresponding to the outer circumferential portion.

5. The surface emitting semiconductor laser according to claim 4, wherein the central portion has a diameter equal to or smaller than a diameter of the high refractive index region.

6. The surface emitting semiconductor laser according to claim 1, wherein the light confining layer confines carrier in the high refractive index region.

7. The surface emitting semiconductor laser according to claim 1,
wherein the substrate has a substantially columnar structure formed thereon, and the light confining layer is formed in the substantially columnar structure, and
wherein the low refractive index region is an oxidized region selectively oxidized from a side surface of the substantially columnar structure, and the high refractive index region is a non-oxidized conductive region.

8. A surface emitting semiconductor laser device comprising:
the surface emitting semiconductor laser according to claim 1; and
an optical member that receives laser light incident thereon from the surface emitting semiconductor laser.

9. An optical transmission device comprising:
the surface emitting semiconductor laser device according to claim 8; and
a transmission unit that transmits, via an optical medium, the laser light emitted from the surface emitting semiconductor laser device.

10. An information processing apparatus comprising:
the surface emitting semiconductor laser according to claim 1;
a condensing unit that condenses laser light emitted from the surface emitting semiconductor laser onto a recording medium; and
a mechanism that scans, on the recording medium, the laser light condensed by the condensing unit.

* * * * *